US008323871B2

(12) United States Patent
Burns et al.

(10) Patent No.: US 8,323,871 B2
(45) Date of Patent: Dec. 4, 2012

(54) ANTIREFLECTIVE HARDMASK COMPOSITION AND A METHOD OF PREPARING A PATTERNED MATERIAL USING SAME

(75) Inventors: Sean D. Burns, Yorktown Heights, NY (US); David R. Medeiros, Hopewell Junction, NY (US); Dirk Pfeiffer, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 318 days.

(21) Appl. No.: 12/711,748

(22) Filed: Feb. 24, 2010

(65) Prior Publication Data

US 2011/0207047 A1    Aug. 25, 2011

(51) Int. Cl.
*G03F 7/00* (2006.01)
*G03F 7/11* (2006.01)
*G03F 7/40* (2006.01)

(52) U.S. Cl. .................. 430/271.1; 430/270.1; 430/311; 430/317; 430/322; 430/913; 430/927

(58) Field of Classification Search ............... 430/270.1, 430/271.1, 273.1, 927, 913, 311, 322, 317
See application file for complete search history.

(56) References Cited

U.S. PATENT DOCUMENTS

| 4,273,420 | A | 6/1981 | Watanabe et al. |
| 4,719,146 | A | 1/1988 | Hohage et al. |
| 4,855,017 | A | 8/1989 | Douglas |
| 5,362,663 | A | 11/1994 | Bronner et al. |
| 5,429,710 | A | 7/1995 | Akiba et al. |
| 5,562,801 | A | 10/1996 | Nulty |
| 5,580,819 | A | 12/1996 | Li et al. |
| 5,618,751 | A | 4/1997 | Golden et al. |
| 5,668,237 | A | 9/1997 | Popall et al. |
| 5,744,376 | A | 4/1998 | Chan et al. |
| 5,801,094 | A | 9/1998 | Yew et al. |
| 5,821,469 | A | 10/1998 | Shanmugham |
| 5,886,102 | A | 3/1999 | Sinta et al. |
| 5,939,236 | A | 8/1999 | Pavelchek et al. |
| 5,948,570 | A | 9/1999 | Kornblit et al. |
| 6,013,582 | A | 1/2000 | Ionov et al. |
| 6,037,097 | A | 3/2000 | Bucchignano et al. |
| 6,316,167 | B1 | 11/2001 | Angelopoulos et al. |
| 6,420,084 | B1 | 7/2002 | Angelopoulos et al. |
| 6,514,667 | B2 | 2/2003 | Angelopoulos et al. |
| RE38,256 | E | 9/2003 | Ushirogouchi |
| 6,669,995 | B1 | 12/2003 | Insalaco et al. |
| 6,730,454 | B2 | 5/2004 | Pfeiffer et al. |
| 6,743,726 | B2 | 6/2004 | Lu et al. |
| 7,011,935 | B2 | 3/2006 | Schlicht et al. |
| 7,326,442 | B2 * | 2/2008 | Babich et al. .................. 427/534 |
| 7,585,613 | B2 * | 9/2009 | Ogihara et al. ............ 430/272.1 |
| 2003/0209515 | A1 | 11/2003 | Pavelchek |
| 2004/0058275 | A1 | 3/2004 | Neef et al. |
| 2004/0253535 | A1 | 12/2004 | Cameron et al. |
| 2005/0042538 | A1 | 2/2005 | Babich et al. |
| 2005/0112382 | A1 | 5/2005 | Allen et al. |
| 2006/0014099 | A1 | 1/2006 | Faler et al. |
| 2006/0093959 | A1 | 5/2006 | Huang et al. |
| 2006/0141390 | A1 | 6/2006 | Lee et al. |
| 2006/0154177 | A1 | 7/2006 | Ho et al. |
| 2007/0015083 | A1 | 1/2007 | Babich et al. |
| 2008/0187731 | A1 | 8/2008 | Allen et al. |
| 2009/0029284 | A1 | 1/2009 | Matsumaru et al. |
| 2009/0136869 | A1 * | 5/2009 | Ogihara et al. ............ 430/270.1 |
| 2009/0176165 | A1 | 7/2009 | Cheon et al. |
| 2010/0086872 | A1 * | 4/2010 | Ogihara et al. ............ 430/272.1 |

FOREIGN PATENT DOCUMENTS

| CA | 1204547 | 5/1986 |
| JP | 59175725 | 10/1984 |
| JP | 1147535 | 6/1989 |
| JP | 1293339 | 11/1989 |
| JP | 2003157808 | 5/2003 |
| JP | 2004158639 | 6/2004 |
| JP | 2004172222 | 6/2004 |

OTHER PUBLICATIONS

International Search Report and Written Opinion dated Feb. 28, 2011 issued in corresponding International Application No. PCT/US10/53652.

* cited by examiner

*Primary Examiner* — Amanda C. Walke

(74) *Attorney, Agent, or Firm* — Scully, Scott, Murphy & Presser, P.C.; Daniel P. Morris, Esq.

(57) ABSTRACT

An antireflective hardmask composition layer including a polymer having Si—O and non-silicon inorganic units in its backbone. The polymer includes chromophore and transparent moieties and a crosslinking component. The antireflective hardmask composition layer is employed in a method of forming a patterned material on a substrate.

18 Claims, No Drawings

ANTIREFLECTIVE HARDMASK COMPOSITION AND A METHOD OF PREPARING A PATTERNED MATERIAL USING SAME

FIELD OF THE INVENTION

The present invention relates to semiconductor devices and, more particularly, to antireflective hardmask compositions and techniques for use of antireflective hardmask compositions for processing semiconductor devices.

BACKGROUND OF THE INVENTION

The need to remain cost and performance competitive in the production of semiconductor devices has driven the industry to a continuing increase in device density with a concomitant decrease in device geometry. To facilitate the shrinking device dimensions, new lithographic materials, processes and tools are being considered. Typical lithographic processes involve formation of a patterned resist layer by patternwise exposing the radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is then removed. Currently, 248 nm and 193 nm lithography are being pursued to print sub 200 nm features.

To do this, tools with higher numerical aperture (NA) are emerging. The higher NA allows for improved resolution but reduces the depth of focus of aerial images projected onto the resist. Because of the reduced depth of focus, a thinner resist will be required. As the thickness of the resist is decreased, the resist becomes less effective as a mask for subsequent dry etch image transfer to the underlying substrate. Without significant improvement in the etch resistance exhibited by current single layer resists, these systems cannot provide the necessary lithography and etch properties for high-resolution lithography.

Another problem with single layer resist systems is critical dimension (CD) control. Substrate reflections at ultraviolet (UV) and deep ultraviolet (DUV) wavelengths are notorious for producing standing wave effects and resist notching, which severely limit CD control of single layer resists. Notching results from substrate topography and non-uniform substrate reflectivity, which causes local variations in exposure energy on the resist. Standing waves are thin film interference (TFI) or periodic variations of light intensity through the resist thickness. These light variations are introduced because planarization of the resist presents a different thickness through the underlying topography. Thin film interference plays a dominant role in CD control of single layer photoresist processes, causing large changes in the effective exposure dose due to a tiny change in the optical phase. Thin film interference effects are described in "Optimization of optical properties of resist processes" (T. Brunner, SPIE Proceedings Vol. 1466, p. 297, 1991), the teaching of which is incorporated herein by reference.

Bottom antireflective coatings or BARC's have been used with single layer resists to reduce thin film interference. However, these thin absorbing BARCs have fundamental limitations. For some lithographic imaging processes, the resist used does not provide sufficient resistance to subsequent etching steps to enable effective transfer of the desired pattern to a layer underlying the resist. The resist typically gets consumed after transferring the pattern into the underlying BARC and substrates. In addition, the migration to smaller sub-90 nm node feature sizes requires the use of an ultra thin resist (>200 nm) in order to avoid image collapse. In many instances where a substantial etching depth is required, and/or where it is desired to use certain etchants for a given underlying material, the resist thickness is insufficient to complete the etch process. In addition the radiation-sensitive resist material employed does not provide resistance to subsequent etching steps sufficient enough to enable effective transfer of the desired pattern to the layer underlying the radiation-sensitive resist and anti-reflective coating (ARC).

In many cases, where the underlying material layer to be etched is thick, where a substantial etching depth is required, where it is desirable to use certain etchants for a given underlying layer, or any combination of the above it would be desirable to employ an antireflective hardmask. The antireflective hardmask layer could serve as an intermediate layer between the patterned radiation-sensitive resist material and the underlying material layer to be patterned. The antireflective hardmask layer receives the pattern from the patterned radiation-sensitive resist material layer by reactive ion etching (RIE) followed by the transfer of the pattern to the underlying material layer. The antireflective hardmask layer should be able to withstand the etching processes required to transfer the pattern onto the underlying material layer. Furthermore, a thin antireflective hardmask layer is desirable to receive the pattern by RIE from the resist layer, especially if a thin resist are used. While many materials useful as ARC compositions are known, there is a need for improved antireflective hardmask compositions with high etch selectivity to the radiation-sensitive resist material and to the underlying material layer. Further, many of the known antireflective hardmasks are difficult to apply to the substrate, e.g., applying these ARC's may require the use of chemical vapor deposition (U.S. Pat. No. 6,316,167; U.S. Pat. No. 6,514,667). It would be advantageous to apply the antireflective hardmask material by spin-on techniques like conventional organic BARC currently used in manufacturing.

In addition, antireflective hardmask materials are difficult to remove after pattern transfer. Typically organic BARC are removed by a wet or dry ashing process. CVD deposited hardmask layers are difficult to remove without damaging the underlying dielectric substrate. Ideally, the antireflective hardmask materials can be removed easily by a wet strip with high selectivity to the underlying substrates.

Thus, it would be desirable to be able to perform lithographic techniques with high etch selectivity yet sufficient resistance to multiple etchings. Such lithographic techniques would enable production of highly detailed semiconductor devices.

SUMMARY OF THE INVENTION

The present invention provides antireflective hardmask compositions and techniques for the use of antireflective hardmask compositions for processing of semiconductor devices. In one aspect of the invention, an antireflective hardmask layer for lithography is provided.

The antireflective hardmask layer comprises a polymer with an Si—O backbone containing a non-silicon based inorganic moiety incorporated into the backbone comprising at least one chromophore moiety and at least one transparent moiety and a crosslinking component. The polymer may comprise any combination of an acid generator and an additional crosslinking component.

In another aspect of the invention, a method for processing a semiconductor device is provided. The method comprises the steps of: providing a material layer on a substrate; forming an antireflective hardmask layer over the material layer, forming a radiation-sensitive imaging layer over the antireflective hardmask layer; patternwise exposing the radiation-sensitive imaging layer to radiation thereby creating a pattern of radiation-exposed regions in the imaging layer; selectively removing portions of the radiation-sensitive imaging layer and the antireflective hardmask layer to expose portions of the material layer; and etching the exposed portions of the material layer, thereby forming a patterned material feature on the substrate. In addition the invention also describes removal of residual antireflective hardmask layer after patterning A more complete understanding of the present invention, as well as further features and advantages of the present invention, will be obtained by reference to the following detailed description and drawing.

DETAILED DESCRIPTION OF PREFERRED EMBODIMENTS

A lithographic structure comprising an antireflective hardmask composition (hereinafter "the composition") is disclosed herein. In one aspect of the invention the composition comprises a polymer with an Si—O backbone containing a non-silicon inorganic moiety incorporated into the backbone comprising at least one chromophore moiety, at least one transparent moiety, and a crosslinking component. The polymer may comprise any combination of an acid generator and an additional crosslinking component. The composition comprises a polymer having an Si—O backbone and a non-silicon based inorganic unit incorporated into the backbone have a repeating structural formula selected from the group consisting of:

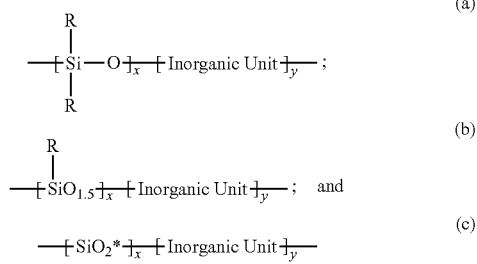

wherein x is at least 1; y is at least 1; R is a chromophore, at least one transparent moiety, or at least one transparent moiety and a crosslinking component with the proviso that the inorganic unit contains no silicon; and

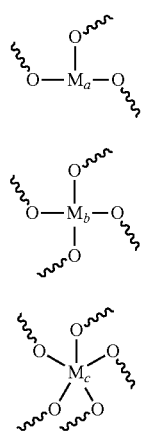

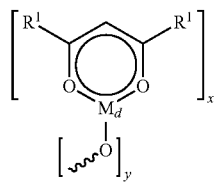

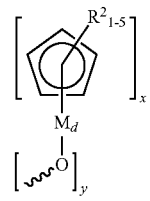

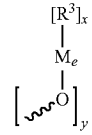

wherein x and y have the meanings above; $M_a$ is Sc, Y, La, B, Al, Ga, In or a lanthanide metal; $M_b$ is Ti, Zr, Hf, Ge or Sn; $M_c$ is V, Nb, Ta, P or

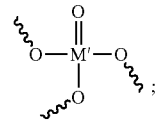

$M_d$ is Ti, Zr, Hf, Sc, Y, La, a lanthanide metal, V, Nb or Ta; $M_e$ is Ge or Sn; M' is V or P; $R^1$ is the same or different and is $C_1$-$C_6$ alkyl, $C_1$-$C_6$ alkoxy, phenyl or phenoxy; $R^2$ is the same or different and is $C_1$-$C_6$ alkyl or $C_1$-$C_6$ alkoxy; $R^3$ is the same or different and is $C_1$-$C_6$ alkyl or phenyl, with the proviso that $M_d$ may be another transition metal or a metal of Groups 2 to 5 of the Periodic Table.

In an exemplary embodiment wherein the polymer containing Si—O in the backbone and an inorganic unit which includes no Si, the composition has at least one or more Si—O units and at least one or more inorganic non-silicon containing units. The presence of the inorganic unit within the polymer backbone ensures hardmask properties of the composition (especially when any one of the underlayers comprises a silicon oxide, nitride and/or dielectric containing Si and C) and stripability. The Si—O-containing units may be a siloxane, silsesquioxane or silicon oxide (sol gel) building block. The antireflective hardmask layer should have solution and film-forming characteristics conducive to layer formation by conventional spin coating.

As mentioned above, each R group can be either a chromophore moiety, a transparent moiety, or a crosslinking component. The polymer containing Si—O bonds in its backbone is generally transparent to most wavelengths employed. However, the introduction of fluorine-containing moieties, which are substantially transparent to the imaging radiation, may be desirable. In some instances, the crosslinking component may be the transparent or chromophore moiety depending on the organic functional group attached to the Si—O unit. In some cases, depending on the metal present, the inorganic unit can also act as the chromophore since some metal oxides may not be transparent, like the Si—O units, at the desired imaging radiation. The transparent and chromophore moieties are balanced to achieve the desired absorbance for antireflective properties at any radiation suitable for lithography.

The chromophore moiety may comprise any suitable chromophore moiety that can be grafted onto the SiO-containing units with suitable radiation absorption characteristics and which does not adversely affect the performance of either the antireflective hardmask composition or any overlying radiation-sensitive layers. Suitable chromophore moieties include, but are not limited to, phenyl, chrysenes, pyrenes, fluoranthrenes, anthrones, benzophenones, thioxanthones, and anthracenes. Anthracene derivatives, for example those described in Renner, U.S. Pat. No. 4,371,605 "Photopolymerizable Compositions Containing N-hydroxyamide and N-hydroxyimide Sulfonates," the disclosure of which is incorporated by reference herein, may also be used (e.g., 9-anthracene methanol is a preferred chromophore for 248 nanometer (nm) lithography). The chromophore moiety preferably does not contain nitrogen, except for possibly deactivated amino nitrogen such as in phenol thiazine. For 193 nm lithography, aliphatic compounds containing unsaturated carbon bonds, e.g., carbon-to-carbon double bonds, are also suitable chromophores. For 157 nm lithography, compounds containing saturated carbon-to-carbon bonds can act as chromophores.

The chromophore moieties may be chemically attached to Si—O or inorganic unit units by acid-catalyzed O-alkylation or C-alkylation, such as by Friedel-Crafts alkylation. Alternatively, the chromophore moiety may be attached to the SiO-containing units by an esterification mechanism. In an exemplary embodiment, from about 1 percent to about 40 percent of the SiO-containing units contain chromophore moieties. The site for attachment of the chromophore moieties can be an aromatic group, such as a hydroxybenzyl or a hydroxymethylbenzyl group. Alternatively, the chromophore moieties may be attached to the Si—O units through reaction with other moieties that are present, such as alcohols. The reaction, used to attach the chromophore moieties to the SiO-containing units, preferably comprises esterification of a hydroxyl group.

In addition, the inorganic unit can act as the chromophore since some metals absorb at the desired wavelength. The metal may require a ligand for stability reasons. This ligand, such as cyclopentadienyl groups can act as chromophores and have to be balanced with the Si—O containing units to achieve appropriate absorbance for antireflective properties.

The transparent moieties may vary depending on the wavelength or character of the imaging radiation used. In case of 248 nm lithography the transparent moiety can include phenyl and phenol-based substituents. In the case of 193 or 157 nm lithography, the transparent moieties used are generally organic moieties free of unsaturated carbon-to-carbon bonds. Functional groups with saturated carbon-carbon bonds may include alcohols, ethers and epoxides.

To achieve desirable optical properties for the composition, less than or equal to about 50 percent of the transparent moieties should contain unsaturated carbon to carbon bonds, especially in the case of 193 nm lithography. In the case of 157 nm lithography, the transparent moieties may contain fluorocarbon substituents to enhance transparency. It may be desirable to balance the number of transparent moieties and chromophore moieties to provide favorable combinations of energy absorption and antireflection.

The composition further comprises a crosslinking component. The crosslinking component may be attached to the polymer (e.g., on the polymer backbone), or may be included externally (i.e., not attached to the polymer), or a combination of both. Furthermore, the crosslinking component can be a polymer attached to the backbone and crosslink by itself or with an external crosslink. Crosslinking can be catalyzed by acid, preferably, generated by a thermally activated acid generator within the composition. The crosslinking reaction catalyzed by the generation of an acid is activated by heating. An acid generator will be described in detail below. Therefore the composition requires baking to achieve sufficient crosslinking to make the film insoluble in organic solvents as well as aqueous base.

The crosslinking component comprises any suitable crosslinking functional group known in the negative photoresist art which is compatible with other components of the composition. The crosslinking component may act to crosslink the polymers in the presence of a generated acid.

Suitable crosslinking components include, but are not limited to, aromatic alcohols, and phenol-based substituents for 248 nm lithography. The preferred crosslinking components for 193 and 157 nm lithography include alcohols and epoxides attached to substituents free of unsaturated carbon-to-carbon bonds, as well as alcohol and epoxide substituents containing fluorine, and compositions comprising at least one of the foregoing alcohols and epoxides. Further suitable crosslinking components may include vinyl ethers.

The crosslinking component may also comprise SiOH bonds (silanols), formed during the synthesis of the composition, attached to the SiO moiety. Crosslinking may also be achieved by silanol condensation via a sol gel process where SiOH bonds condense to form Si—O—Si bonds. The SiOH groups can also react with Metal-OH groups attached to the inorganic unit to form Si—O-Metal bonds. The Si—O—Si and Si—O-Metal bonds connect the polymer to form a crosslinked network with or without the crosslinking component described above.

Examples of the transparent moiety, chromophore moiety and crosslinking component attached to the Si—O unit suitable for this invention are further described in U.S. Pat. No. 6,730,454 and the Japanese Patent Application No. 2004-158639, filing date May 28, 2004; priority Japanese Patent Application No. 2003-157808 with priority date Jun. 3, 2004 and Japanese Patent Application No. 2004-172222, filing date Jun. 10, 2004 and references cited therein the disclosures of which are incorporated herein by reference.

The composition comprises a polymer with Si—O moieties and inorganic moieties containing any combination, in any ratios of the transparent moiety, chromophore moiety and crosslinking component attached to the polymer backbone. A typical composition may comprise 1-50% by mol of the chromophore unit and 1-99 molar % of the transparent moiety and/or the crosslinking component and 0 to 20% by weight of an external crosslinking component.

The polymer comprising Si—O and inorganic units in backbone units, has a weight average molecular weight, before reaction with any crosslinking component, of at least about 500. For example, the Si—O and inorganic moieties may have a weight average molecular weight of from about 1,000 to about 10,000.

The composition may comprise an additional crosslinking component. The additional crosslinking component preferably comprises a compound that can be reacted with the polymer of the composition by any suitable manner, including, for example, catalysis by a generated acid, and/or heating. Generally, the additional crosslinking component may comprise any additional crosslinking agent known in the negative photoresist art which is compatible with the other components of the composition. Suitable additional crosslinking agents include, but are not limited to, glycoluril compounds including methylated glycolurils, butylated glycolurils, tetramethoxymethyl glycoluril, methylpropyltetramethoxymethyl glycoluril, methylphenyltetramethoxymethyl glycoluril, 2,6-bis(hydroxymethyl)-p-cresol compounds, etherified amino resins including methylated melamine resins, N-methoxymethyl-melamine, butylated melamine resins, N-butoxymethyl-melamine, bis-epoxies, bis-phenols, bisphenol-A and compositions comprising at least one of the foregoing additional crosslinking agents.

Suitable glycoluril compounds include POWDERLINK™ compounds, a trademark of Cytec Industries. Suitable 2,6-bis (hydroxymethyl)-p-cresol compounds include those described in Masaaki, Japanese Patent Application JP1293339A2 "Photoresist Compositions," the disclosure of which is incorporated by reference herein. Suitable methylated glycolurils and butylated glycolurils include those described in Kirchmayr, Canadian Patent 1204547, "Curable Composition Based On an Acid-Curable Resin, and Process for Curing this Resin," the disclosure of which is incorporated by reference herein.

The composition may further comprise an acid generator. The acid generator comprises an acid generating group that liberates acid upon thermal treatment (a thermal acid generator). A variety of known thermal acid generators may be used, including, but not limited to, 2,4,4,6-tetrabromocyclohexadienone, benzoin tosylate, 2-nitrobenzyl tosylate, other alkyl/perfluoroalkyl esters of organic sulfonic acids and compositions comprising at least one of the foregoing thermal acid generators. Compounds that generate a sulfonic acid upon activation are generally suitable and include the thermally activated acid generators described in Sinta et al., U.S. Pat. No. 5,886,102 "Antireflective Coating Compositions" (hereinafter "Sinta") and in Pavelchek et al., U.S. Pat. No. 5,939,236 "Antireflective Coating Compositions Comprising Photoacid Generators," (hereinafter "Pavelchek"), the disclosures of which are incorporated by reference herein.

A radiation-sensitive acid generator may be employed as an alternative to, or in combination with, the thermal acid generator. Radiation-sensitive acid generators generally known in the resist art may be used, as long as they are compatible with the components of the composition. Suitable radiation-sensitive acid generators include those described in Sinta and Pavelchek.

When a radiation-sensitive acid generator is used, the crosslinking temperature may be reduced by the application of radiation to induce acid generation, which in turn catalyzes the crosslinking reaction. Even if a radiation-sensitive acid generator is used, the composition may be thermally treated to accelerate the crosslinking process. It may be advantageous to accelerate the crosslinking process, for example, in the case of production line fabrication.

Further examples of the external crosslinker and acid generator suitable for this invention is described in U.S. Pat. No. 6,730,454 and the Japanese patent application 2004-158639 (filing date May 28, 2004; priority Japanese patent application 2003-157808 with priority date Jun. 3, 2004) and Japanese patent application 2004-172222 (filing date Jun. 10, 2004) and references cited therein.

The composition may comprise from about 1 wt. % to about 20 wt. %, on a solids basis, of an acid generator. For example, the composition may comprise from about 1 wt. % to about 15 wt. %, on a solids basis, of an acid generator.

The composition may be used in combination with any desired resist material to form a lithographic structure. In an exemplary embodiment, the resist material can be imaged with shorter wavelength ultraviolet radiation, for example, with a wavelength on the order of 248 nm or less, or with electron beam radiation. Suitable resist materials are described, for example, in Bucchignano et al., U.S. Pat. No. 6,037,097, "E-beam Application to Mask Making Using New Improved KRS Resist System," the disclosure of which is incorporated by reference herein.

The composition typically comprises a solvent prior to application to a desired substrate. Suitable solvents include solvents conventionally used with resist materials and which do not have an excessively adverse impact on the performance of the composition. Exemplary solvents include, but are not limited to, propylene glycol monomethyl ether acetate, butanol, propylene glycol monomethylether, cyclohexanone and ethyl lactate. The solvent should be present in the composition in an amount sufficient to achieve a solids content of about 5 wt. % to about 20 wt. %. Higher solids content formulations will generally yield thicker coating layers. The composition of the present invention may further contain minor amounts of auxiliary components, e.g., base additives, as are known in the art.

The compositions provided herein have an adequate shelf life. Further, the compositions provided herein prevent adverse interactions with the imaging layer, e.g., by acid contamination from the hardmask layer.

The composition can be prepared by combining the polymer comprised of Si—O and inorganic units in the polymeric backbone, a crosslinking component and an acid generator, as well as any other desired ingredients using conventional methods. The formation of an antireflective hardmask layer using the composition is described below.

The composition is especially useful in conjunction with the lithographic processes used to manufacture semiconductor devices, e.g., lithographic processes employing 193 nm, 157 nm, x-ray, electron beam or other imaging radiation. Thus, further disclosed herein is a method for processing a semiconductor device.

Semiconductor lithographic applications generally involve the transfer of a pattern to a material layer provided on a semiconductor substrate. The composition of the present invention may be formed into an antireflective hardmask layer over the material layer by spin coating, followed by baking, to achieve crosslinking and solvent removal. In an exemplary embodiment, baking is conducted at a temperature of less than or equal to about 250 degrees centigrade (° C.). For example, baking may be conducted at a temperature of from about 150° C. to about 220° C. The duration of baking may vary depending on the thickness of the layers and baking temperature. In a further exemplary embodiment, baking may be conducted in a forming gas atmosphere at a temperature of from about 250° C. to about 400° C.

The thickness of the antireflective hardmask layers formed from the composition may vary depending on the desired function. For typical applications, the thickness of the antireflective hardmask layer is from about 30 nanometer (nm) to about 500 nm. The antireflective hardmask layers resist lateral etch and may serve as a hardmask layer even at thicknesses generally associated with organic antireflective layers.

In another aspect, the invention encompasses a method of forming a patterned material feature on a substrate, the method comprising:
    (a) providing a material layer on a substrate,
    (b) forming an antireflective hardmask composition of the invention over the material layer,
    (c) forming a radiation-sensitive imaging layer over the antireflective composition,
    (d) patternwise exposing the imaging layer to radiation thereby creating a pattern of radiation-exposed regions in the imaging layer, (e) selectively removing portions of the imaging layer and the antireflective hardmask composition to expose portions of the material layer, and (f) etching the exposed portions of the material layer, thereby forming the patterned material feature.

The material layer may be a conductive material, a semiconductive material, a magnetic material, an insulative material, a metal, a dielectric material or a combination comprising at least one of the foregoing materials, depending on the stage of the manufacture process and the material desired for the end product. Some particular examples of material layers include silicon oxide materials, silicon nitride materials, polysilicon materials, and low-k dielectric materials known in the art, which typically include silicon, carbon, and oxygen.

The antireflective hardmask layer is preferably applied directly over the material layer to be patterned. A radiation-sensitive imaging layer can then be formed, either directly or indirectly, over the antireflective hardmask layer.

The radiation-sensitive imaging layer may be applied using spin-coating techniques. The substrate with the material layer, the antireflective hardmask layer and the radiation-sensitive imaging layer may then be heated, i.e., pre-exposure baked, to remove solvent and improve the coherence of the radiation-sensitive imaging layer. The radiation-sensitive imaging layer should be as thin as possible while still being substantially uniform and sufficient to withstand subsequent processing, such as reactive ion etching, to transfer the lithographic pattern to the underlying material layer. The duration of the pre-exposure bake may be from about 10 seconds to about 900 seconds. For example, the duration of the pre-exposure bake may be from about 15 seconds to about 60 seconds. The pre-exposure bake temperature may vary depending on the glass transition temperature of the radiation-sensitive imaging layer.

After solvent removal, the radiation-sensitive imaging layer is then patternwise exposed to the desired radiation, for example, ultraviolet radiation having a wavelength less than or equal to about 200 nm, i.e., 193 nm ultraviolet radiation. When scanning particle beams, such as an electron beam, are used, patternwise exposure may be achieved by scanning the particle beam across the semiconductor device and selectively applying the particle beam according to the desired pattern. However, typically, when wavelike radiation, such as 193 nm ultraviolet radiation, is used, the patternwise exposure is conducted through a mask which is placed over the radiation-sensitive imaging layer. The total exposure energy for 193 nm ultraviolet radiation may be less than or equal to about 100 millijoules per square centimeter (millijoules/$cm^2$). For example, the total exposure energy may be less than or equal to about 50 millijoules/$cm^2$, such as between about 15 millijoules/$cm^2$ to about 30 millijoules/$cm^2$.

After patternwise exposure, the radiation-sensitive imaging layer is typically baked, e.g., post-exposure baked, to further complete the acid-catalyzed reaction and to enhance the contrast of the exposed pattern. The post-exposure bake is conducted at a temperature of from about 60° C. to about 175° C. For example, the post-exposure bake may be conducted at a temperature of from about 90° C. to about 160° C. The post-exposure bake is preferably conducted for a duration of from about 30 seconds to about 300 seconds.

After the post-exposure bake, the radiation-sensitive imaging layer with the desired pattern is obtained, e.g., developed, by contacting the radiation-sensitive imaging layer with a developer, such as an organic solvent or alkaline solution that selectively dissolves and removes the areas of the radiation-sensitive imaging layer which were exposed to the radiation. Suitable alkaline developer solutions include aqueous solutions of tetramethylammonium hydroxide (TMAH) and/or ammonium hydroxide. The resulting lithographic structure is then typically dried to remove any remaining solvent from the developer.

The composition of the invention advantageously uses a thin silicon-containing layer for efficient pattern transfer by reactive ion etching from the resist, even if a very thin sub-200 nm resist thickness is used. By optimizing RIE conditions, excellent selectivity between the silicon and organic layer is accomplished to ensure good pattern transfer. Once the organic layer receives the pattern the patterning into the underlying material can continue since there is sufficient organic material left for all subsequent etch steps. The RIE plasma typically includes carbon, fluorine, chlorine, bromine, sulfur, hydrogen, oxygen, or a mixture thereof.

In addition, one embodiment of this invention involves proper pattern transfer based on the etch selectivity between resist, antireflective hardmask composition and material layer. By choosing CF-based RIE chemistry, pattern transfer from the resist into the antireflective hardmask composition is established without consuming much resist. The high etch selectivity, in combination with choosing the appropriate thickness for the antireflective hardmask composition, enables the use of thinner resists as well. Then the pattern is transferred into the underlying material. The antireflective hardmask composition, due to the presence of the inorganic units, shows good etch selectivity to the underlying material layer. The photoresist may or may not be removed before patterning the material layer. The antireflective hardmask composition can be removed selectively from the underlying material layer by any method known to those in the art. In some case, especially if the underlying material layer is a silicon containing low K dielectric, the antireflective hardmask composition can be removed by a wet strip that contains fluoride, tetramethylammonium hydroxide, or ammonium hydroxide.

The compositions of the invention and resulting lithographic structures can be used to create patterned material layer structures, such as metal wiring lines, holes for contacts or vias, insulation sections (e.g., damascene trenches or shallow trench isolation), trenches for capacitor structures, and the like, that can be used in the design of integrated circuit devices. The compositions are especially useful in the context of creating patterned layers of oxides, nitrides or polysilicon.

The antireflective hardmask and resulting lithographic structure can be used to form patterned features on the substrate, such as metal wiring lines, holes for contacts or vias, insulation sections, including damascene trenches or shallow trench isolation trenches for capacitor structures, and any other like structures that can be used in the design of integrated circuit devices. The teachings herein are useful in creating patterned material layers of oxides, nitrides, polysilicon or chrome.

Examples of general lithographic processes wherein the composition of the present invention may be useful are disclosed in Douglas, U.S. Pat. No. 4,855,017, "Trench Etch Process for a Single-Wafer RIE Dry Etch Reactor," Bronner et al., U.S. Pat. No. 5,362,663, "Method of Forming Double Well Substrate Plate Trench DRAM Cell Array," Akiba et al., U.S. Pat. No. 5,429,710, "Dry Etching Method," Nulty, U.S. Pat. No. 5,562,801, "Method of Etching an Oxide Layer," Golden et al., U.S. Pat. No. 5,618,751, "Method of Making Single-Step Trenches Using Resist Fill Recess," Chan et al., U.S. Pat. No. 5,744,376, "Method of Manufacturing Copper Interconnect With Top Barrier Layer," Yew et al., U.S. Pat. No. 5,801,094, "Dual Damascene Process," Shanmugham, U.S. Pat. No. 5,821,469, "Device for Securing Cables in a Telecommunications System," Komblit, U.S. Pat. No. 5,948,570, "Process for Dry Lithographic Etching," the disclosures of which are incorporated by reference herein. Other examples of pattern transfer processes are described in W. Moreau, SEMICONDUCTOR LITHOGRAPHY, PRINCIPLES, PRACTICES, AND MATERIALS, Ch. 12-13 (1988), the disclosure of which is incorporated by reference herein. While exemplary lithographic processes are described and referenced herein, it should be understood that the present invention should not limited to any particular lithographic technique or device structure.

Further disclosed herein is a patterned lithographic structure. The patterned lithographic structure comprises: a substrate; a material layer over the substrate; a patterned antireflective hardmask layer over the material layer, the patterned antireflective hardmask layer comprising the composition; and a patterned radiation-sensitive imaging layer over the antireflective hardmask layer.

Although illustrative embodiments of the present invention have been described herein, it is to be understood that the invention is not limited to those precise embodiments, and that various other changes and modifications may be made by one skilled in the art without departing from the scope or spirit of the invention. The following examples are provided to illustrate the scope and spirit of the present invention. Because these examples are given for illustrative purposes only, the invention embodied therein should not be limited thereto.

EXAMPLES

Example 1

Preparation and Analysis of an Antireflective Hardmask Layer

A sample vial was charged with 4 g of Dowanol® PM solution, obtained from Aldrich, and a 1 g mixture of sol gel precursors. The Dowanel® PM solution was prepared by combining Dowanol® PM (100 g) and FC-4430 surfactant (0.5 g). The 1 g mixture of sol gel precursor comprised 0.381 g Silane Precursor A (0.45 mol %); 0.069 g Silane Precursor B (0.1 mol %); and 0.549 g $Ti(OC_4H_9)_4$, where Silane Precursor A was a compound having the structured formula:

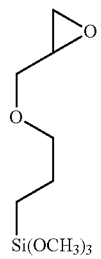

and Silane Precursor B was a compound having the structural formula

The contents of the vial were stirred for 5 minutes at room temperature after which 1 g of 1N HCl was added disperse under vigorous stirring. The resulting clear solution was stirred at room temperature for 1 hour and then filtered through a 0.2 micron membrane filter. The filtrate was directly applied to a silicon wafer and spun at 3,000 rpm for 60 seconds followed by exposure to a temperature of 215° C. for 2 minutes.

The thus prepared antireflective hardmask layer was analyzed to determine its thickness, and its index optical constants: refraction (n) and extraction coefficient (k), measured at 193 nm, utilizing an n&k Analyzer®, manufactured by n&k Technology, Inc. In addition, an Rutherford Back Scattering (RBS) analysis of the hardmask layer was conducted. The results of these analyses are summarized in Table 1.

Example 2

Preparation and Analysis of an Antireflective Hardmask Layer

A second antireflective hardmask layer was prepared and analyzed in accordance with the procedure set forth in Example 1 but for the constituency of the 1 gram of silane precursor introduced into the sample vial.

In this example Silane Precursor A was utilized in a weight of 0.444 g, Silane Precursor B was used in a weight of 0.081 g and the third constituent was $Ge(OC_2H_5)_4$, present in an amount of 0.475 g.

The repeating structural unit of the antireflective hardmask composition layers of Examples 1 and 2 are as follows:

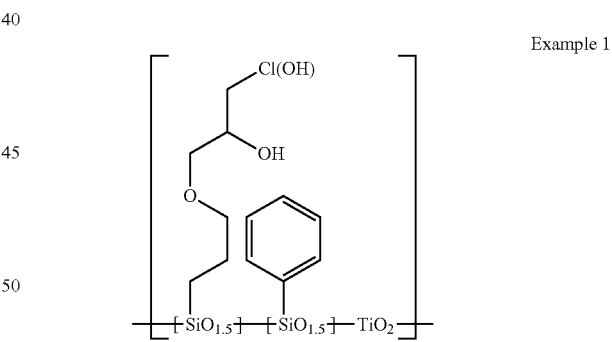

Example 1

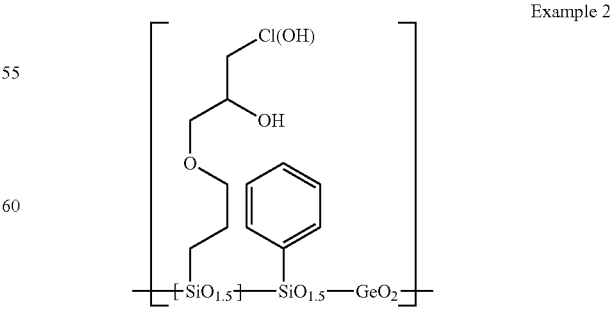

Example 2

A summary of the antireflective hardmask composition layers of Examples 1 and 2 is provided in Table 1.

TABLE 1

| | | | Antireflective Hardmask Layer | | | |
|---|---|---|---|---|---|---|
| Example No. | Silane Pre A, g | Silane Pre B, g | Third Comp, g | Layer Thick, Å | n (193 nm) | k (193 nm) |
| 1 | 0.381 | 0.069 | Ti(OC$_4$H$_9$)$_4$, .549 | 2332 | 1.735 | 0.301 |
| 2 | 0.444 | 0.081 | Ge(OC$_2$H$_5$)$_4$, .475 | 3073 | 1.725 | 0.294 |

| | | | Atomic Concentration, % | | | |
|---|---|---|---|---|---|---|
| Ex. No. | [S] | [O] | [C] | [H] | [Cl] | [Ti] | [Ge] |
| 1 | 6.1 ± 2 | 19.3 ± 2 | 30.1 ± 2 | 37.3 ± 2 | 2.9 ± 0 | 4.3 ± 0.2 | None |
| 2 | 6.1 ± 2 | 18.9 ± 2 | 27.0 ± 2 | 40.9 ± 2 | 2.9 ± 0 | None | 4.2 ± 0.2 |

Example 3

193 nm Lithographic Layer Over Antireflective Hardmask Layer

An approximately 250 nm thick layer of acrylic-based photoresist was spun-coated over the cured antireflective hardmask layer of Example 1. This radiation-sensitive photoresist imaging layer was heated at 130° C. for 60 seconds. The heated imaging layer was then imaged using a 0.75 NA 193 nm ASML Stepper with conventional and annular illumination using AFSM reticle.

After patternwise exposure, the radiation sensitive imaging layer was heated at 130° C. for 60 seconds. The image was developed using a conventional developer (0.26M TMAH). The resulting pattern had 120 nm contact holes, 113.75 nm lines and 104 nm space patterns.

Example 4

Pattern Transfer by Reactive Ion Etching

The contact holes, lines and space patterns formed on the antireflective hardmask layer in Example 3 were transferred onto silicon oxide by a 20 second fluorocarbon based etch using a LAM RIE tool.

The observed etch selectivity of the antireflective hardmask layer to the photoresist was approximately 2:1. The etch rate of the blanket films of Example 1 in a trifluoromethane/methane plasma was 613 Å/min., in a chlorine plasma 813 Å/min.; and in a nitrogen/hydrogen plasma 62 Å/min. The silicon oxide etch rate was 2000 Å/min.

Example 5

Stripping the Antireflective Hardmask Composition Layer

The antireflective hardmask composition layers of Examples 1 and 2 were removed from the silicon wafers upon which they were coated by dipping the wafers in a liquid mixture of hydrogen fluoride/ethylene glycol, prepared by mixing 2 ml of 49% HF in 250 ml ethylene glycol at 60° C., followed by dipping the thus treated wafers in AZ 400 T® (a commercially available strip formulation) produced by Clariant at 80° C., each dip conducted for 5 minutes.

The above described embodiments and examples are provided to illustrate the scope and spirit of the present invention. These embodiments and examples will suggest, to those skilled in the art, other embodiments and examples. These other embodiments and examples are within the contemplation of the present invention. Therefore, the present invention should be limited only by the appended claims.

What is claimed is:

1. An antireflective hardmask composition comprising a polymer having a repeating structural unit selected from the group consisting of

(i)

(ii)

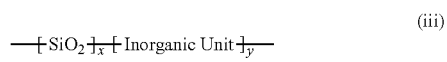

(iii)

wherein x is at least 1; y is at least 1; R is an organic functional unit selected from one or more chromophore moieties, transparent moieties, and crosslinking components, and wherein said inorganic unit is selected from the group consisting of

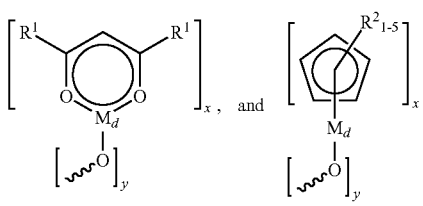

wherein x and y have the meanings given above; $M_d$ is selected from Ti, Zr, Hf, Sc, Y, La, V, Nb, Ta and lanthanide rare earth metals; $R^1$ is the same or different and is selected from $C_1$-$C_6$ alkyl, $C_1$-$C_6$ alkoxy, phenyl and phenoxy; and $R^2$ is the same or different and is selected from $C_1$-$C_6$ alkyl and $C_1$-$C_6$ alkoxy.

2. A composition in accordance with claim 1 wherein said polymer further comprises an acid generator.

3. A composition in accordance with claim 2 wherein said polymer further comprises an additional crosslinking component.

4. A composition in accordance with claim 3 wherein said additional crosslinking component is selected from glycoluril, methoxylated glycoluril, butylated glycoluril, tetramethoxymethyl glycoluril, methylpropyltetramethoxymethyl glycoluril, 2,6-bis(hydroxymethyl)-p-cresol, an etherified amino resin, a methylated melamine resin, N-methoxymethylmelamine, a butylated melamine resin, N-butoxymethylmelamine, a bis-epoxy, a bisphenol, bisphenol A, and mixtures thereof.

5. A composition in accordance with claim 3 wherein said additional crosslinking component is present in a concentration, on a solids basis, of between about 1 wt. % and about 20 wt. %.

6. A composition in accordance with claim 2 wherein said acid generator is selected from 2,4,4,6-tetrabromocyclohexadienone, benzoin tosylate, 2-nitrobenzyl tosylate, an alkyl or perfluoroalkyl ester of an organic sulfonic acid, and mixtures thereof.

7. A composition in accordance with claim 2 wherein said acid generator is present in a concentration, on a solids basis, of between about 1 wt. % and about 20 wt. %.

8. A composition in accordance with claim 1 further comprising an organic solvent which is present in a concentration such that the solid content of the composition is between about 5 wt. % and about 20 wt. %.

9. A composition in accordance with claim 1 wherein said composition is in the form of a layer having a thickness of between about 30 nm and about 500 nm.

10. A composition in accordance with claim 1 wherein said polymer has a weight average molecular weight of at least about 500.

11. A composition in accordance with claim 10 wherein said weight average molecular weight is in the range of between about 1,000 and about 10,000.

12. A method of forming a patterned material on a substrate comprising the steps of:
   (a) providing a material layer on a substrate;
   (b) forming an antireflective hardmask composition over said material layer;
   (c) forming a radiation-sensitive imaging layer over said antireflective hardmask composition;
   (d) patternwise exposing said imaging layer to radiation thereby creating a pattern of radiation-exposed regions in said imaging layer;
   (e) selectively removing portions of said imaging layer and said underlying antireflective hardmask composition to expose portions of said material layer; and
   etching said exposed portions of said material layer thereby forming a patterned material feature, wherein said antireflective hardmask composition comprises a polymer having a repeating structural unit selected from the group consisting of

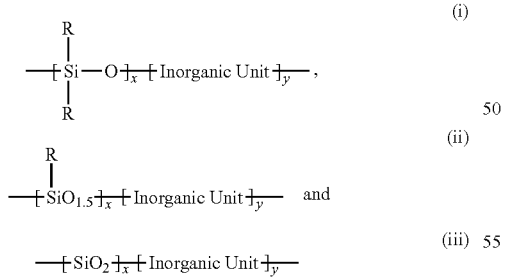

wherein x is at least 1; v is at least 1; R is an organic functional unit selected from one or more chromophore moieties, transparent moieties, and crosslinking components, and wherein said inorganic unit is selected from the group consisting of

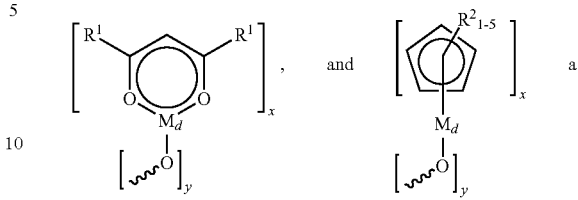

wherein x and y have the meanings given above; $M_d$ is selected from Ti, Zr, Hf, Sc, Y, La, V, Nb, Ta and lanthanide rare earth metals; $R^1$ is the same or different and is selected from $C_1$-$C_6$ alkyl, $C_1$-$C_6$ alkoxy, phenyl and phenoxy; and $R^2$ is the same or different and is selected from $C_1$-$C_6$ alkyl and $C_1$-$C_6$ alkoxy.

13. A method in accordance with claim 12 wherein said material layer is a conductive material, a semiconductive material, a magnetic material, an insulative material, a metal, a dielectric material, or a combination thereof.

14. A method in accordance with claim 13 wherein said material layer is selected from silicon oxide, silicon nitride, polysilicon, and a low-k dielectric materials comprising silicon, carbon and oxygen.

15. A method in accordance with claim 12 wherein said radiation is selected from ultraviolet radiation having a wavelength of less than 200 nm, and electron beam radiation.

16. A method in accordance with claim 12 wherein said etching occurs by reactive ion etching in a plasma comprising carbon, fluorine, chlorine, bromine, sulfur, hydrogen, oxygen or mixtures thereof.

17. A method in accordance with claim 12 wherein said step (e) occurs by contact of said substrate with a developer selected from organic solvents, an aqueous tetramethylammonium hydroxide solution, an aqueous ammonium hydroxide solution, and mixtures thereof.

18. A composition in accordance with claim 1 wherein said inorganic units has the formula

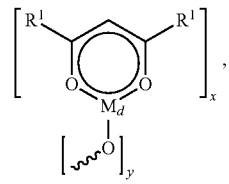

wherein $M_d$, $R^1$, x and y are as defined above.

* * * * *